United States Patent
Sato

(10) Patent No.: US 9,789,688 B2
(45) Date of Patent: Oct. 17, 2017

(54) ELECTRONIC DEVICE, AND METHOD FOR MANUFACTURING ELECTRONIC DEVICE

(71) Applicant: SEIKO EPSON CORPORATION, Tokyo (JP)

(72) Inventor: Naoya Sato, Chino (JP)

(73) Assignee: Seiko Epson Corporation, Tokyo (JP)

(*) Notice: Subject to any disclaimer, the term of this patent is extended or adjusted under 35 U.S.C. 154(b) by 0 days.

(21) Appl. No.: 15/060,211

(22) Filed: Mar. 3, 2016

(65) Prior Publication Data

US 2016/0271951 A1   Sep. 22, 2016

(30) Foreign Application Priority Data

Mar. 17, 2015  (JP) ................................ 2015-052889

(51) Int. Cl.
*B41J 2/16* (2006.01)
*B41J 2/14* (2006.01)

(52) U.S. Cl.
CPC ............. *B41J 2/1623* (2013.01); *B41J 2/14* (2013.01); *B41J 2/14201* (2013.01); *B41J 2/14233* (2013.01); *B41J 2/161* (2013.01); *B41J 2/1607* (2013.01); *B41J 2/1631* (2013.01); *B41J 2002/14419* (2013.01); *B41J 2002/14491* (2013.01); *H01L 2224/2919* (2013.01); *H01L 2224/29082* (2013.01)

(58) Field of Classification Search
None
See application file for complete search history.

(56) References Cited

U.S. PATENT DOCUMENTS

| | | |
|---|---|---|
| 2005/0116995 A1 | 6/2005 | Tanikawa et al. |
| 2006/0203042 A1 | 9/2006 | Murata et al. |
| 2006/0221115 A1 | 10/2006 | Patil |
| 2009/0122100 A1 | 5/2009 | Hida |
| 2009/0237454 A1* | 9/2009 | Kanemoto ........... B41J 2/14233 347/47 |
| 2011/0267796 A1 | 11/2011 | Yoshimura et al. |
| 2012/0229554 A1 | 9/2012 | Goto |

FOREIGN PATENT DOCUMENTS

| | | |
|---|---|---|
| EP | 2 639 072 | 9/2013 |
| JP | 05-220955 | 8/1993 |
| JP | 07-195693 | 8/1995 |

(Continued)

OTHER PUBLICATIONS

Machine Translation of JP 07195693A "Ink Jet Recording Head and Its Manufacture", Koyama, Shuji et al., Aug. 1, 1995, Canon, Inc., Paragraphs 0001, 0011-0012, 0014, 0018-0019, 0030.*

(Continued)

*Primary Examiner* — Lisa M Solomon
(74) *Attorney, Agent, or Firm* — Workman Nydegger

(57) ABSTRACT

A bonding resin that bonds substrates to each other in a state of being spaced with a gap between the substrates is configured by stacking a photosensitive resin and a bonding reinforcement resin which is different from the photosensitive resin, the photosensitive resin is patterned in one substrate, and the bonding reinforcement resin which is stacked on the patterned photosensitive resin has a fillet being a wet-spreading portion or a portion which swells outward from the photosensitive resin.

6 Claims, 8 Drawing Sheets

(56) References Cited

FOREIGN PATENT DOCUMENTS

| JP | 2000-289197 | | 10/2000 |
|----|-------------|---|---------|
| JP | 2011148249 A | * | 8/2011 |
| JP | 2014-051008 | | 3/2014 |

OTHER PUBLICATIONS

Machine Translation of JP 2011-148249A "Liquid Ejection Head, Liquid Ejection Head Unit, and Liquid Ejection Device", Ko, Takeshi, Aug. 4, 2011, Seiko Epson Corp, Paragraphs 0002, 0014, 0024.*
European Search Report for Application No. 16157286.2 dated Oct. 10, 2016.

* cited by examiner

ELECTRONIC DEVICE, AND METHOD FOR MANUFACTURING ELECTRONIC DEVICE

The entire disclosure of Japanese Patent Application No: 2015-052889, filed Mar. 17, 2015 is expressly incorporated by reference herein in its entirety.

BACKGROUND

1. Technical Field

The present invention relates to an electronic device where a first substrate and a second substrate are bonded to each other in a state of interposing a bonding resin having photosensitivity between the first substrate and the second substrate, and a method for manufacturing the same.

2. Related Art

An electronic device is a device including a drive element such as a piezoelectric element which is deformed by applying a voltage, and is applied to various types of apparatuses or sensors. For example, in a liquid ejecting apparatus, various types of liquids are ejected from a liquid ejecting head using the electronic device. As such a liquid ejecting apparatus, for example, there is an image recording apparatus such as an ink jet type printer or an ink jet type plotter, but recently, the liquid ejecting head using the electronic device is also applied to various types of manufacturing apparatuses by using a feature which enables to accurately land a very small amount of liquid at a predetermined position. For example, the liquid ejecting head using the electronic device is applied to a display manufacturing apparatus that manufactures a color filter of a liquid crystal display or the like, an electrode forming apparatus that forms an electrode of an organic electro luminescence (EL) display, a field emission display (FED) or the like, and a chip manufacturing apparatus that manufactures a biochip (biochemical element). A liquid ink is ejected from a recording head for the image recording apparatus, and solutions of each of color materials of red (R), green (G), and blue (B) are ejected from a color material ejecting head for the display manufacturing apparatus. Moreover, a liquid electrode material is ejected from an electrode material ejecting head for the electrode forming apparatus, and a solution of a bio-organic matter is ejected from a bio-organic matter ejecting head for the chip manufacturing apparatus.

The liquid ejecting heads described above include the electronic device where a pressure chamber forming substrate on which a pressure chamber communicating with a nozzle is formed, a piezoelectric element (one type of drive element) which causes a pressure change to be generated in the liquid of the pressure chamber, and a sealing plate (which may be referred to as a protective substrate) which is arranged by being spaced with a gap against the piezoelectric element are stacked. In recent years, a technology of arranging a drive circuit relating to a driving of an actuator such as the piezoelectric element in the sealing plate has been developed. Therefore, a technology of bonding the substrates to each other by an adhesive agent (adhesive resin) which is configured of a photosensitive resin in a state of being spaced with a space between the substrates has been proposed (for example, see JP-A-2000-289197). In addition, a structure in which the substrates are stacked by a bonding resin (hereinafter, photosensitive resin) having photosensitivity in order to respond to high wiring density or miniaturization thereof, is adopted in a semiconductor package of micro electro mechanical systems (MEMS) such as various types of sensors.

FIG. 8A to FIG. 8D are process drawings for describing examples of bonding processes of substrates in the related art. As illustrated in FIG. 8A, a photosensitive resin 53 is applied onto a first substrate 52, and thereafter, as illustrated in FIG. 8B, the applied photosensitive resin 53 is patterned into a predetermined shape through exposure and developing. However, if the photosensitive resin 53 is not cured to a certain degree at the time of the developing, there is concern that the photosensitive resin 53 is peeled off from the substrate or the shape collapses, or there is a problem that patterning accuracy is lowered. Regarding the photosensitive resin 53, although the curing also proceeds at the time of the exposure, it is preferable that the curing proceeds by 50% or more before the developing, after the photosensitive resin 53 is fixed onto the substrate in order to suppress a defect at the time of the developing. Therefore, a heat treatment (prebaking) is performed before the developing. On the other hand, since the curing of the photosensitive resin 53 proceeds by the heat treatment in this manner, in the state where the substrates are bonded to each other as illustrated in FIG. 8C and FIG. 8D, there are problems that an adhesive strength of the photosensitive resin 53 is insufficient, and adhesion reliability is lowered.

SUMMARY

An advantage of some aspects of the invention is to provide an electronic device, and a method for manufacturing an electronic device which are capable of achieving both of patterning accuracy and adhesion reliability of a photosensitive resin.

Aspect 1

According to Aspect 1 of the invention, there is provided an electronic device where a first substrate and a second substrate are bonded to each other in a state of being spaced from each other with a gap by interposing a bonding resin between the first substrate and the second substrate, in which the bonding resin is configured by stacking a photosensitive resin and a bonding reinforcement resin which is different from the photosensitive resin, the photosensitive resin is patterned in at least one substrate of the first substrate and the second substrate, and the bonding reinforcement resin which is stacked on the patterned photosensitive resin, has a wet-spreading portion or a portion which swells outward from the photosensitive resin.

According to a configuration of Aspect 1, it is possible to achieve both of patterning accuracy and adhesion reliability of the photosensitive resin. That is, regarding the photosensitive resin in the bonding resin, it is possible to advance the curing in comparison with the related art by exposure or heating in a previous stage of the developing, and it is possible to improve the patterning accuracy. Meanwhile, since it is possible to reinforce the adhesion strength by the bonding reinforcement resin, it is possible to bond the substrates to each other more firmly. Moreover, since it is possible to achieve both of the patterning accuracy and the adhesion reliability of the photosensitive resin, it is possible to manufacture the electronic device more stably, and it is possible to expect the improvement of a yield rate.

Aspect 2

In the electronic device according to Aspect 1, it is preferable to adopt a configuration in which the bonding reinforcement resin is an adhesive agent which does not have photosensitivity, and of which viscosity is lower than that of the photosensitive resin.

According to a configuration of Aspect 2, it is possible to reinforce the bonding by using the adhesive agent of the low viscosity which does not have photosensitivity, and it is possible to contribute to cost reduction.

Aspect 3

In the electronic device according to Aspect 1 or Aspect 2, it is preferable to adopt a configuration in which a resin of the same type as the photosensitive resin or the bonding reinforcement resin, is formed at a bonding region between the bonding resin and the other substrate.

According to a configuration of Aspect 3, particularly, by adopting the configuration in which the resin of the same type as the photosensitive resin is formed at the bonding region between the bonding resin and the other substrate, since it is possible to prevent the bonding reinforcement resin from wet-spreading with respect to the substrate, it is possible to arrange the bonding resin to be closer to a structure in the substrate. Thereby, it is possible to achieve the high density of the structure and the bonding resin in the substrate, and it is possible to contribute to the miniaturization of the electronic device.

Aspect 4

According to Aspect 4 of the invention, there is provided a method for manufacturing an electronic device where a first substrate and a second substrate are bonded to each other in a state of being spaced from each other with a gap by interposing a bonding resin which is configured by stacking a photosensitive resin and a bonding reinforcement resin between the first substrate and the second substrate, the method including applying the photosensitive resin to at least one substrate of the first substrate and the second substrate, patterning the applied photosensitive resin through exposure, temporary curing by heating, and developing, applying the bonding reinforcement resin such that the bonding reinforcement resin overlaps the patterned photosensitive resin, and bonding the first substrate and the second substrate to each other, in the state of interposing the bonding resin between the first substrate and the second substrate.

According to the method of Aspect 4, it is possible to achieve both of the patterning accuracy and the adhesion reliability of the photosensitive resin.

Aspect 5

In the method for manufacturing an electronic device according to Aspect 4, it is preferable to adopt a method in which in the applying of the bonding reinforcement resin, the bonding reinforcement resin is applied by a transfer method.

According to the method of Aspect 5, it is possible to accurately apply a predetermined amount of the bonding reinforcement resin at a predetermined position.

BRIEF DESCRIPTION OF THE DRAWINGS

The invention will be described with reference to the accompanying drawings, wherein like numbers reference like elements.

DESCRIPTION OF EXEMPLARY EMBODIMENTS

Hereinafter, modes for carrying out the invention will be described with reference to the accompanying drawings. Embodiments described below are variously limited as a suitable specific example of the invention, but unless the gist of particularly limiting the invention is written in the following description, the scope of the invention is not limited to the embodiments. Moreover, in the following description, an ink jet type printer (hereinafter, printer) being one type of liquid ejecting apparatus on which an ink jet type recording head (hereinafter, recording head) being one type of liquid ejecting head including an electronic device according to an embodiment of the invention is mounted, will be described by being used as an example.

Figure 1:
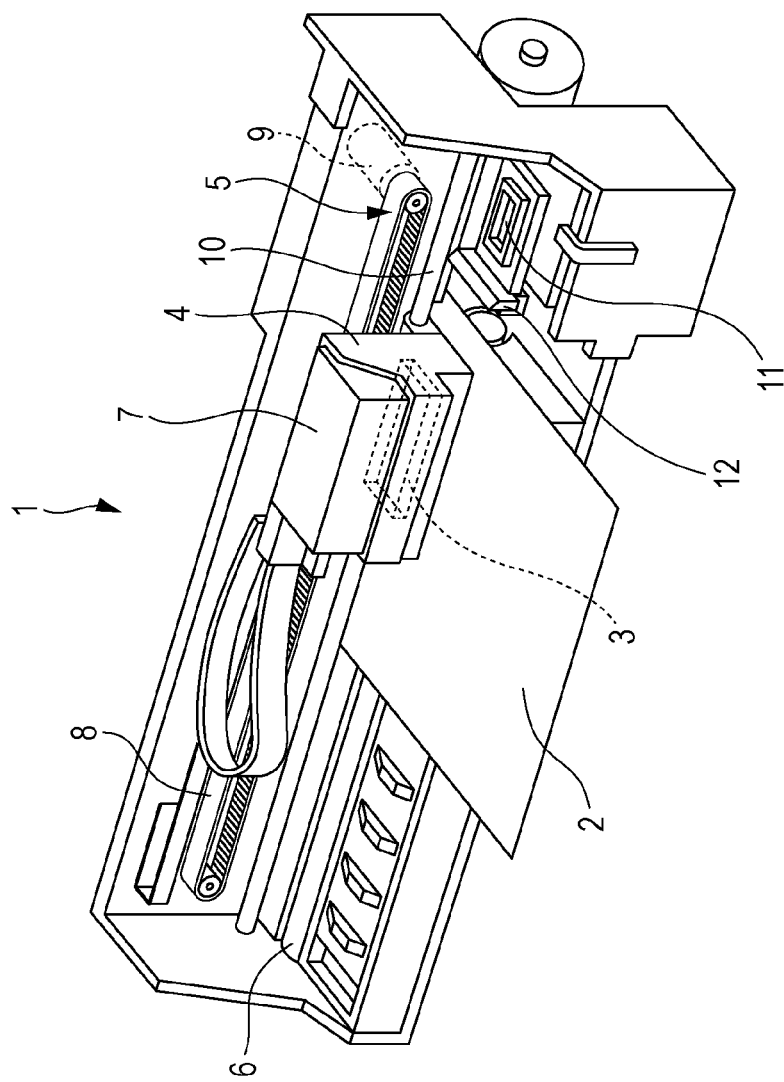
FIG. 1 is a perspective view for describing a configuration of a printer.

A configuration of a printer 1 will be described with reference to FIG. 1. The printer 1 is an apparatus that performs a recording of an image or the like by ejecting and discharging an ink (one type of liquid) onto a surface of a recording medium 2 such as a recording sheet. The printer 1 includes a recording head 3, a carriage 4 to which the recording head 3 is attached, a carriage transfer mechanism 5 that transfers the carriage 4 in a main scanning direction, and a transport mechanism 6 that transports the recording medium 2 in a sub-scanning direction. Here, the ink is reserved in an ink cartridge 7 as a liquid supply source. The ink cartridge 7 is detachably attached to the recording head 3. A configuration in which the ink cartridge is arranged on a main body side of the printer, and the ink is supplied to the recording head through an ink supply tube from the ink cartridge, may be adopted.

The carriage transfer mechanism 5 includes a timing belt 8. Therefore, the timing belt 8 is driven by a pulse motor 9 such as a DC motor. Accordingly, if the pulse motor 9 is operated, the carriage 4 is guided to a guide rod 10 which is laid in the printer 1, and reciprocates in the main scanning direction (width direction of the recording medium 2). A position of the main scanning direction of the carriage 4 is detected by a linear encoder which is not illustrated in the drawing. The linear encoder transmits a detection signal, namely, an encoder pulse to a control unit of the printer 1.

Moreover, a home position that becomes a base point of a scanning of the carriage 4, is set at an end unit region which is an outer side than the recording region within a transfer range of the carriage 4. At the home position, a cap 11 that seals a nozzle 22 which is formed on a nozzle face (nozzle plate 21) of the recording head 3, and a wiping unit 12 for wiping off the nozzle face are arranged in sequence from the end unit side.

Figure 2:
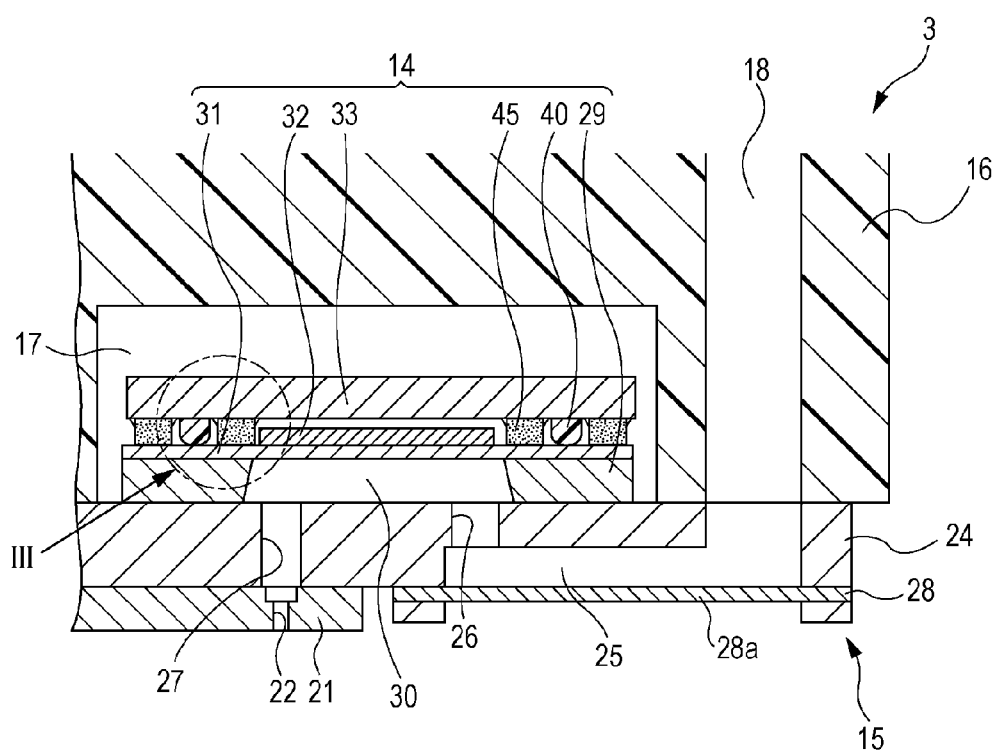
FIG. 2 is a sectional view for describing a configuration of a recording head.
Figure 3:
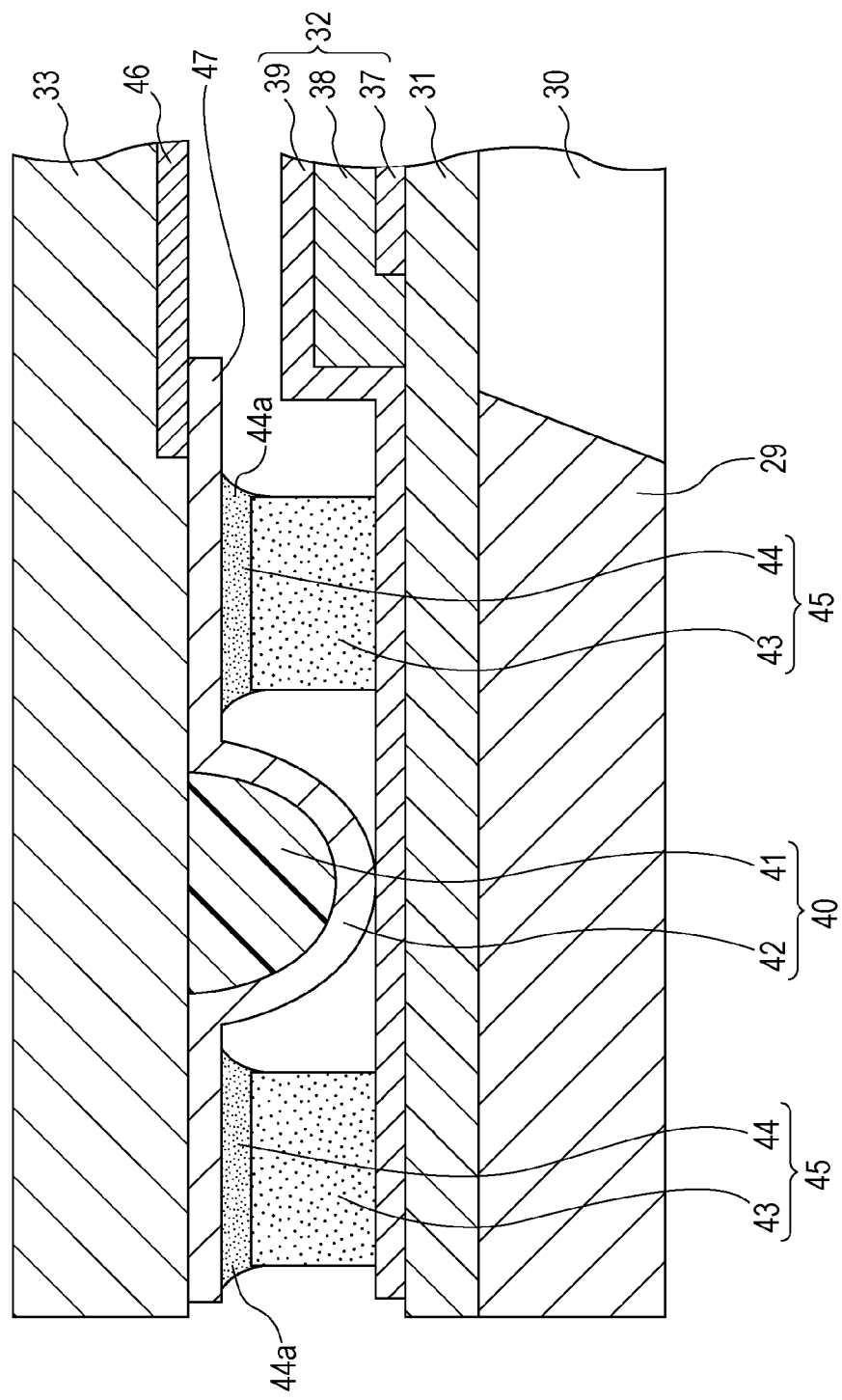
FIG. 3 is an enlarged sectional view of a main portion of an electronic device.

Next, the recording head 3 will be described. FIG. 2 is a sectional view for describing a configuration of the recording head 3. FIG. 3 is an enlarged view of a region III in FIG. 2, and is a sectional view of a case of enlarging a main portion of an electronic device 14 which is incorporated into the recording head 3. In the embodiment, the recording head 3 is attached to a head case 16 in a state where the electronic device 14 and a flow path unit 15 are stacked, as illustrated in FIG. 2. Furthermore, for the sake of convenience, a stacking direction of the respective members will be described as an upper and lower direction.

The head case 16 is a box-shaped member made of a synthetic resin, and a first reservoir 18 that supplies the ink to each pressure chamber 30 is formed therein. The first reservoir 18 is a space where the ink that is common to a plurality of pressure chambers 30 which are arranged in parallel is reserved, and is formed along a nozzle array direction. Furthermore, an ink introduction path (not illustrated) which introduces the ink from the ink cartridge 7 side to the first reservoir 18, is formed on an upper side of the head case 16. Moreover, on a lower face side of the head case 16, an accommodation space 17 which is concave into a rectangular parallelepiped shape up to the middle of a height direction of the head case 16 from the lower face is formed. If the flow path unit 15 described later is bonded in the state of being positioned on the lower face of the head case 16, the electronic device 14 (a pressure chamber forming substrate 29, a sealing plate 33 and the like) which is stacked on a communicating substrate 24, is configured so as to be accommodated within the accommodation space 17.

The flow path unit 15 which is boned to the lower face of the head case 16, includes the communicating substrate 24, the nozzle plate 21, and a compliance substrate 28. In the embodiment, the communicating substrate 24 is manufactured from a silicon single crystal substrate. In the communicating substrate 24, as illustrated in FIG. 2, a second reservoir 25 which communicates with the first reservoir 18, and where the ink which is common to each of the pressure chambers 30 is reserved, and an individual communicating path 26 that individually supplies the ink from the first reservoir 18 through the second reservoir 25 to each of the pressure chambers 30 are formed by an etching. The second reservoir 25 is a long empty portion along the nozzle array direction (parallel arrangement direction of the pressure chamber 30). A plurality of individual communicating paths 26 are formed along the parallel arrangement direction of the pressure chamber 30 by correlating with each of the pressure chambers 30. The individual communicating path 26 communicates with the end unit of one side in a longitudinal direction of the pressure chamber 30 responding thereto, in the state where the communicating substrate 24 and the pressure chamber forming substrate 29 are bonded to each other.

Moreover, at a position responding to each nozzle 22 of the communicating substrate 24, a nozzle communicating path 27 which penetrates into a plate thickness direction of the communicating substrate 24 is formed. That is, a plurality of nozzle communicating paths 27 are formed along the nozzle array direction by responding to the nozzle array. The pressure chamber 30 communicates with the nozzle 22 through the nozzle communicating path 27. In the embodiment, the nozzle communicating path 27 communicates with the end unit of the other side (opposite side to the individual communicating path 26) in the longitudinal direction of the pressure chamber 30 responding thereto, in the state where the communicating substrate 24 and the pressure chamber forming substrate 29 are bonded to each other.

The nozzle plate 21 is a substrate made of silicon or made of metal such as stainless steel which is bonded to the lower face (face of the opposite side to the pressure chamber forming substrate 29) of the communicating substrate 24. In the embodiment, the nozzle plate 21 is bonded to a region which deviates from the compliance substrate 28 (second reservoir 25) in the communicating substrate 24. In the nozzle plate 21, a plurality of nozzles 22 are openly arranged into an array shape. The plurality of nozzles 22 (nozzle array) that are openly arranged into the array shape, are arranged along the sub-scanning direction which is orthogonal to the main scanning direction by a pitch responding to a dot formation density up to the nozzle 22 of the other end side from the nozzle 22 of one end side.

The compliance substrate 28 is a region that deviates from the region to which the nozzle plate 21 of the communicating substrate 24 is bonded, and is bonded to the region responding to the second reservoir 25 in the state of closing an opening of the lower face side of the space which becomes the second reservoir 25. The compliance substrate 28 absorbs a pressure change which is generated in the ink of the reservoirs 18 and 25, by a compliance unit 28a being a flexible face.

In the embodiment, the electronic device 14 is a device that is made by stacking thin plate-shaped configuration members functioning as an actuator which causes the pressure change to be generated in the ink of each of the pressure chambers 30. The electronic device 14 is unitized by stacking the pressure chamber forming substrate 29, a vibrating plate 31, a piezoelectric element 32, and the sealing plate 33, as illustrated in FIG. 2. Furthermore, the electronic device 14 is formed to be smaller than the accommodation space 17 so that the electronic device 14 may be accommodated in the accommodation space 17.

In the embodiment, the pressure chamber forming substrate 29 is manufactured from the silicon single crystal substrate. In the pressure chamber forming substrate 29, a portion thereof is thoroughly removed by the etching in the plate thickness direction, and a space to be the pressure chamber 30 is formed. The spaces, namely, the pressure chambers 30 are plurally arranged in parallel by responding to each nozzle 22. Each of the pressure chambers 30 are the long empty portions in a direction which is orthogonal to the nozzle array direction, and the individual communicating path 26 communicates with the end unit of one side in the longitudinal direction thereof, and the nozzle communicating path 27 communicates with the end unit of the other side.

The vibrating plate 31 is a thin film-shaped member having elasticity, and is stacked on the upper face (face of the opposite side to the communicating substrate 24 side) of the pressure chamber forming substrate 29. By the vibrating plate 31, an upper opening of the space to be the pressure chamber 30 is sealed. In other words, by the vibrating plate 31, the pressure chamber 30 is partitioned. A portion responding to the pressure chamber 30 (in detail, the upper opening of the pressure chamber 30) in the vibrating plate 31, functions as a displacement unit that is displaced in a direction which becomes distant from the nozzle 22 or a direction which comes close to the nozzle 22 depending on a bent deformation of the piezoelectric element 32. That is, a region responding to the upper opening of the pressure chamber 30 in the vibrating plate 31 becomes a drive region where the bent deformation is allowed. Meanwhile, a region which deviates from the upper opening of the pressure chamber 30 in the vibrating plate 31 becomes a non-drive region where the bent deformation is regulated.

For example, the vibrating plate 31 is configured by an elastic film that is made up of silicon dioxide ($SiO_2$) which is formed on the upper face of the pressure chamber forming substrate 29, and an insulating film that is made up of zirconium oxide ($ZrO_2$) which is formed on the elastic film. Therefore, the piezoelectric elements 32 are respectively stacked in the regions responding to each of the pressure chambers 30, namely, the drive region, on the insulating film (face of the opposite side to the pressure chamber forming substrate 29 side of the vibrating plate 31). Furthermore, the pressure chamber forming substrate 29 and the vibrating plate 31 which is staked thereon, are equivalent to a first substrate in the invention. Moreover, the face on which the piezoelectric element 32 is formed in the vibrating plate 31, is a bonding face to which the sealing plate 33 is bonded.

In the embodiment, the piezoelectric element 32 is a piezoelectric element of a so-called bent vibration mode. As illustrated in FIG. 3, for example, the piezoelectric element 32 is made by sequentially stacking a lower electrode layer 37, a piezoelectric layer 38, and an upper electrode layer 39 on the vibrating plate 31. In the embodiment, the upper electrode layer 39 functions as an individual electrode per piezoelectric element 32, and the lower electrode layer 37 functions as a common electrode per piezoelectric element 32. If an electric field is given depending on a potential difference of both electrodes between the lower electrode layer 37 and the upper electrode layer 39, the piezoelectric element 32 which is configured in this manner is bent and deformed in the direction which becomes distant from the nozzle 22 or the direction which comes close to the nozzle 22. As illustrated in FIG. 3, the end unit of the other side (left side in FIG. 3) of the upper electrode layer 39 is extended up to above the vibrating plate 31 responding to the non-drive region over an upper opening edge of the pressure chamber 30. Although being not illustrated, in the same manner, the end unit of one side (right side in FIG. 2) of the lower electrode layer 37 is extended up to above the vibrating plate 31 responding to the non-drive region of the opposite side to the non-drive region where the upper electrode layer 39 is stacked over the upper opening edge of the pressure chamber 30 from the drive region. That is, in the longitudinal direction of the pressure chamber 30, the lower electrode layer 37 is extended up to the non-drive region of one side, and the upper electrode layer 39 is extended up to the non-drive region of the other side. Therefore, bump electrodes 40 responding to each of the extended lower electrode layer 37 and the extended upper electrode layer 39, are electrically connected to the extended lower electrode layer 37 and the extended upper electrode layer 39. The bump electrode 40 will be described later.

The sealing plate 33 (which is equivalent to a second substrate in the invention) is a plate member made of silicon which is formed into a flat plate shape. As illustrated in FIG. 3, a drive circuit 46 relating to the driving of each of the piezoelectric elements 32 is formed in a region which faces the piezoelectric element 32 of the sealing plate 33. The drive circuit 46 is created by using a semiconductor process (namely, a film forming process, a photolithography process, an etching process and the like) on the surface of the silicon single crystal substrate which becomes the sealing plate 33. Moreover, a wiring layer 47 that is connected to the drive circuit 46 is formed on the drive circuit 46 in the face of the piezoelectric element 32 side of the sealing plate 33, in the state of being exposed to the surface of the vibrating plate 31 side in the sealing plate 33, that is, the bonding face of the vibrating plate 31. The wiring layer 47 is an outer side than the drive circuit 46, and is drawn around up to a position responding to the lower electrode layer 37 and the upper electrode layer 39 which are extended in the non-drive region. Furthermore, the wiring layer 47 is integrally expressed in FIG. 3 for the sake of convenience, but includes a plurality of wirings. Specifically, the wiring layer 47 for the individual electrode (upper electrode layer 39) of the piezoelectric element 32, and the wiring layer 47 for the common electrode (lower electrode layer 37) of each of the piezoelectric elements 32 are patterned on the surface of the sealing plate 33. Each of the wiring layers 47 are electrically connected to wiring terminals responding thereto, within the drive circuit 46.

The pressure chamber forming substrate 29 and the sealing plate 33 where the vibrating plate 31 and the piezoelectric element 32 are stacked, are bonded to each other by a bonding resin 45 in the state of interposing the bump electrode 40 therebetween. The bonding resin 45 has a function as a spacer for securing a gap between the substrates, a function as a sealing member for sealing the space which accommodates the piezoelectric element 32 or the like between the substrates, and a function as a bonding agent for bonding the substrates to each other. In the embodiment, the bonding resin 45 is configured by stacking a photosensitive resin 43 and a bonding reinforcement resin 44, and separates the space where the drive region of the piezoelectric element 32 is accommodated and an external space therebetween in the gap of the vibrating plate 31 and the sealing plate 33. As a photosensitive resin 43, for example, a resin which uses an epoxy resins, an acrylic resins, a phenol resin, a polyimide resin, a silicone resin, a styrene resin or the like as a main component, and includes a photopolymerization initiator, is suitably used. Moreover, as a bonding reinforcement resin 44, an adhesive agent which uses the epoxy resin or the like as a main component is used. The bump electrode 40 is an electrode for connecting the drive circuit 46 to the individual electrode (lower electrode layer 37) and the common electrode (upper electrode layer 39) of each of the piezoelectric elements 32, and is arranged so as to be electrically connected by being in contact with the lower electrode layer 37 and the upper electrode layer 39 which are extended up to the non-drive region. A gap is formed between the vibrating plate 31 and the sealing plate 33 by the bump electrode 40 and the bonding resin 45 which is arranged on both sides of the bump electrode 40. The gap is set to the degree in which the distortion and the deformation of the piezoelectric element 32 are not inhibited.

The bump electrode 40 is configured by an internal resin (resin core) 41 as a protrusion stream which is extended along the parallel arrangement direction (nozzle array direction) of the pressure chamber, and a conductive film 42 which is partially formed on the surface of the internal resin 41. For example, the internal resin 41 is made up of a resin having elasticity such as the polyimide resin or the like, and is formed in each of the region that faces the non-drive region where the lower electrode layer 37 of the vibrating plate 31 is formed on the bonding face of the sealing plate 33, and the region that faces the non-drive region where the upper electrode layer 39 is formed. Moreover, the conductive film 42 is a portion of the wiring layer 47, and is formed at each of the positions which face the lower electrode layer 37 (individual electrode). Therefore, a plurality of conductive films 42 are formed along the nozzle array direction. Similarly, the plurality of conductive films 42 responding to the upper electrode layer 39 (common electrode) are formed along the nozzle array direction.

Still more, as illustrated in FIG. 3, the bonding resin 45 is formed into a band shape along the nozzle array direction, on both sides of the bump electrode 40 in the direction which is orthogonal to the nozzle array direction. Therefore, in the embodiment, the photosensitive resin 43 is patterned on each of one side and the other side of the bump electrode 40 in the direction which is orthogonal to the nozzle array direction, and the bonding reinforcement resin 44 is stacked thereon. As a bonding reinforcement resin 44, a resin of which viscosity at the time of bonding the substrates to each other is lower than that of the photosensitive resin 43 is used. Therefore, as illustrated in FIG. 3, a wet-spreading portion (fillet 44a) is included on the bonding face side of the sealing plate 33, by applying the pressure between the substrates at the time of the bonding, in the state after the bonding. The bonding reinforcement resin 44 reinforces the adhesive strength (bonding strength) which is lowered in the patterning process of the photosensitive resin 43. That is, when the photosensitive resin 43 is patterned through exposure and developing, the photosensitive resin 43 after being exposed is cured to a certain degree by a prebaking before the developing, in order to suppress a defect such that the photosensitive resin 43 is peeled off from the substrate or the shape collapses at the time of the developing. Therefore, the adhesive strength of the photosensitive resin 43 is lowered.

In a method for manufacturing the electronic device 14 according to the embodiment of the invention, both of the patterning accuracy and the adhesion reliability of the adhesive agent are achieved, by applying the bonding reinforcement resin 44 such that the bonding reinforcement resin 44 overlaps the patterned photosensitive resin 43, after the photosensitive resin 43 is patterned in one substrate of the vibrating plate 31 and the sealing plate 33, in order to reinforce the lowering in the adhesive strength of the photosensitive resin 43.

Hereinafter, a manufacturing process of the electronic device 14, particularly, a bonding process of the pressure chamber forming substrate 29 as a first substrate where the piezoelectric element 32 and the vibrating plate 31 are stacked, and the sealing plate 33 as the second substrate will be described. Furthermore, in the embodiment, after the bonding of the silicon single crystal substrate where a plurality of regions becoming the sealing plate 33 are formed, and the silicon single crystal substrate where a plurality of regions becoming the pressure chamber forming substrate 29 in which the vibrating plate 31 and the piezoelectric element 32 are stacked are formed, the electronic device 14 is obtained by cutting and dicing the bonded substrates.

FIG. 4A to FIG. 4D, FIG. 5A, and FIG. 5B are schematic views for describing the manufacturing processes of the electronic device 14, and are views illustrating the configurations in the vicinity of the bump electrode 40 and the bonding resin 45. First, the vibrating plate 31 is stacked onto the surface (bonding face of the sealing plate 33) of the pressure chamber forming substrate 29, and the lower electrode layer 37, the piezoelectric layer 38, and the upper electrode layer 39 are sequentially stacked thereon and are patterned, and the piezoelectric element 32 is formed. Thereby, the plurality of region becoming the pressure chamber forming substrate 29 are formed in the single crystal silicon substrate. Meanwhile, in the silicon single crystal substrate of the sealing plate 33 side, first, the drive circuit 46 is formed on the bonding face of the vibrating plate 31 by the semiconductor process. If the drive circuit 46 is formed, the internal resin 41 of the bump electrode 40 is formed on the bonding face of the sealing plate 33. Specifically, after a resin (for example, polyimide resin) being a material is applied by a predetermined thickness, the internal resin 41 which exhibits the protrusion stream is patterned through the prebaking process, the photolithography process, and the etching process at a predetermined position. If the internal resin 41 is formed, the wiring layer 47 and the conductive film 42 are formed by the photolithography process and the etching process, after the metal becoming the wiring layer 47 and the conductive film 42 of the bump electrode 40 is manufactured as a film. Thereby, the plurality of regions becoming the sealing plate 33 are formed in the silicon single crystal substrate.

Figure 4A:
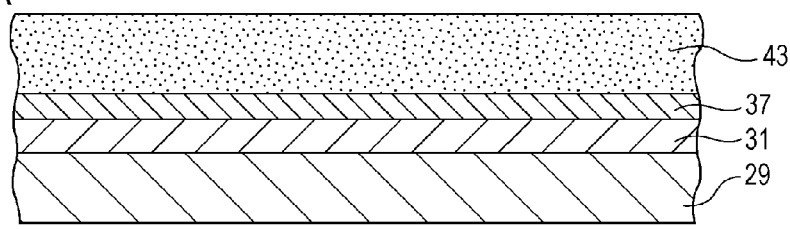
FIG. 4A to FIG. 4D are schematic views for describing manufacturing processes of the electronic device.
Figure 4B:
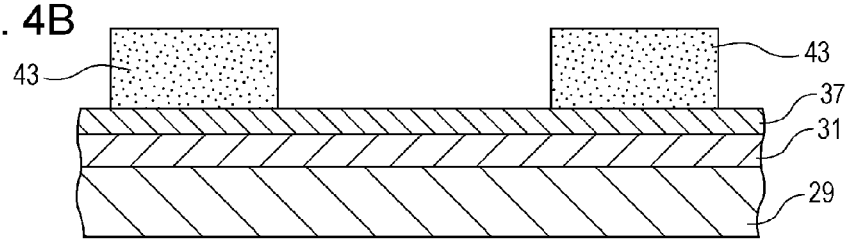

Next, the photosensitive resin 43 is applied onto any one bonding face of the surface (bonding face of the sealing plate 33 side) of the vibrating plate 31 where the pressure chamber forming substrate 29 is stacked, or the surface (bonding face of the vibrating plate 31 side) of the sealing plate 33 (photosensitive resin applying process). In the embodiment, as illustrated in FIG. 4A, on the pressure chamber forming substrate 29 and the vibrating plate 31 (which are equivalent to one substrate in the invention), the photosensitive resin 43 is applied by a spin coating in the state of covering the structure such as the piezoelectric element 32. Subsequently, if the photosensitive resin 43 is applied, the photosensitive resin 43 is temporarily cured by the heat treatment, after being exposed through a mask of a predetermined pattern (temporary curing process). Alternatively, after the photosensitive resin 43 is applied, the exposure may be performed after passing through the heat treatment. In the temporary curing process, a curing degree of the photosensitive resin 43 is adjusted by an exposure amount at the time of the exposure or a heating amount at the time of the heating. Specifically, the temporary curing process of the photosensitive resin is adjusted to the curing degree of approximately 50% in the configuration of the related art, and is adjusted to the curing degree of 80% or more in the embodiment. As illustrated in FIG. 4B, the photosensitive resin 43 is patterned into a predetermined shape at a predetermined position where the developing is performed, in the state where the photosensitive resin 43 is temporarily cured by the temporary curing process (patterning process). In the embodiment, the region where the bump electrode 40 is arranged is interposed, and thereby, the photosensitive resin 43 is patterned into a dyke shape (bank shape) along the nozzle array direction on, each of both sides of the pressure chamber longitudinal direction (direction which is orthogonal to the nozzle array direction) of the region. Here, since the temporary curing process is adjusted to the curing degree of 80% or more, it is suppressed that the photosensitive resin 43 is peeled off from the substrate or the shape of the photosensitive resin 43 collapses (for example, a corner portion is taken off) at the time of the developing, and the photosensitive resin 43 is patterned with higher accuracy.

Figure 4C:
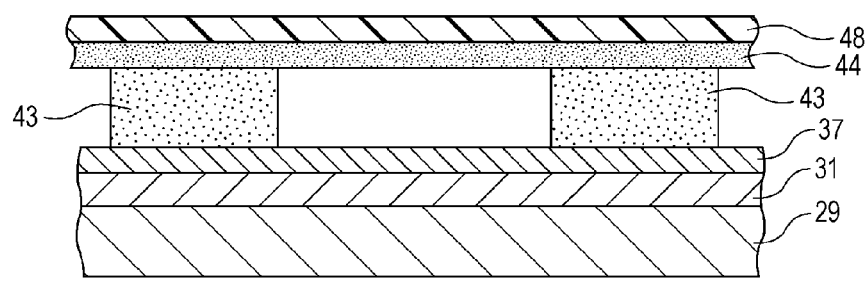
Figure 4D:
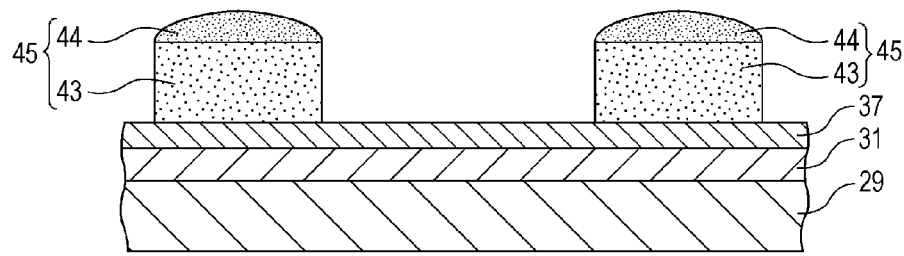

Subsequently, if the photosensitive resin 43 is patterned, the bonding reinforcement resin 44 is applied onto the photosensitive resin 43 such that the bonding reinforcement resin 44 overlaps the photosensitive resin 43 (bonding reinforcement resin applying process). In the process, the applying is performed by a transfer method. Specifically, the bonding reinforcement resin 44 is applied by the uniform thickness with a squeegee to a transfer film 48 on a squeegee stand which is not illustrated in the drawing. As illustrated in FIG. 4C, a layer of the bonding reinforcement resin 44 which is applied to the transfer film 48, is transferred onto the photosensitive resin 43. Thereby, as illustrated in FIG. 4D, the bonding reinforcement resin 44 is stacked by more uniform amount with positional accuracy on the photosensitive resin 43.

Figure 5A:
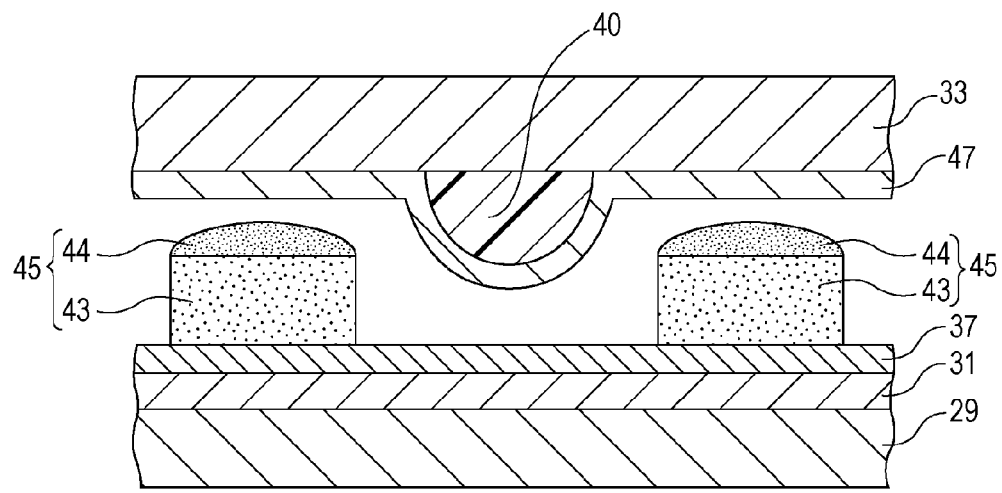
FIG. 5A and FIG. 5B are schematic views for describing the manufacturing processes of the electronic device.
Figure 5B:
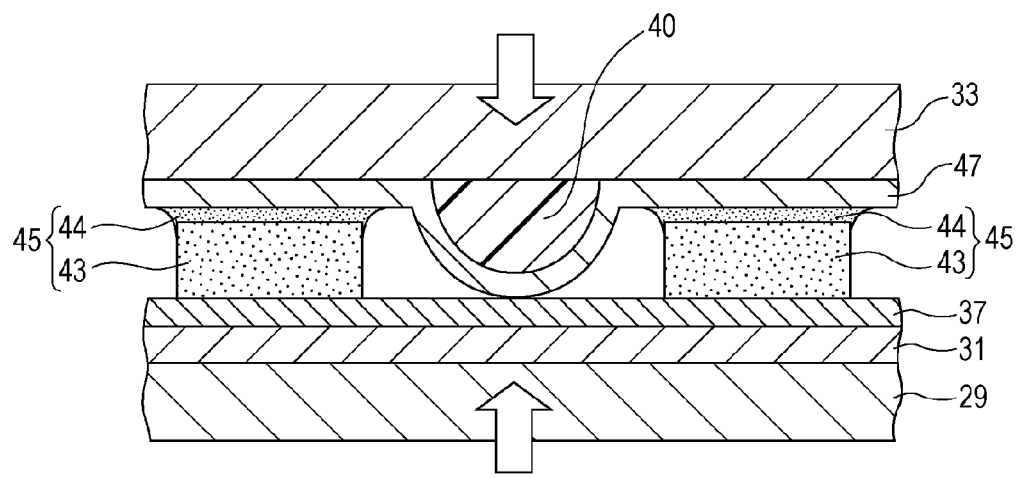

If the bonding resin 45 is formed by applying the bonding reinforcement resin 44 such that the bonding reinforcement resin 44 overlaps the photosensitive resin 43, both of the silicon single crystal substrates are bonded to each other (bonding process). Specifically, as illustrated in FIG. 5A, in the state where the relative positions of both of the silicon single crystal substrates are aligned, any one silicon single crystal substrate is relatively moved toward the other silicon single crystal substrate side, and the structure such as the bump electrode 40 or the piezoelectric element 32, and the bonding resin 45 are stuck together by being interposed between both of the silicon single crystal substrates. At that time, the bump electrode 40 is arranged in the region between a pair of the bonding resins 45. Furthermore, in the state, as illustrated in FIG. 5B, both of the silicon single crystal substrates are pressurized from the upper and lower direction while resisting the elastic restoring force of the bump electrode 40. At that time, since the curing proceeds in the temporary curing process, the photosensitive resin 43 is unlikely to be deformed even when the substrates are pressurized. In contrast, since the viscosity of the bonding reinforcement resin 44 is lower than that of the photosensitive resin 43, the wet-spreading portion is generated on the bonding face side of the sealing plate 33, by applying the pressure between the photosensitive resin 43 and the silicon single crystal substrate of the sealing plate 33 side being the other substrate. As a result, the fillet 44*a* is formed in the bonding reinforcement resin 44, as illustrated in FIG. 3. Therefore, the heat treatment (post-baking) is performed in the state where the pressure between the substrates is maintained. As a result, in the state where the bump electrode 40 is electrically connected to the lower electrode layer 37 and the upper electrode layer 39 in the non-drive region, both of the substrates are bonded to each other by the bonding resin 45.

If both of the silicon single crystal substrates are bonded to each other, the pressure chamber 30 is formed through a lapping process, the photolithography process, and the etching process, with respect to the silicon single crystal substrate of the pressure chamber forming substrate 29 side. Finally, the silicon single crystal substrate is scribed along a predetermined scribing line, and is divided by individually being cut into the electronic devices 14. In the embodiment, a configuration in which two sheets of silicon single crystal substrates are diced after the bonding is exemplified, but it is not limited thereto. For example, after the sealing plate and the pressure chamber forming substrate are respectively diced in advance, the sealing plate and the pressure chamber forming substrate may be bonded to each other.

Therefore, the electronic device 14 which is manufactured by the above processes, is positioned and is fixed in the flow path unit 15 (communicating substrate 24) by using the adhesive agent or the like. Accordingly, the recording head 3 described above is manufactured, by bonding the head case 16 and the flow path unit 15, in the state of accommodating the electronic device 14 in the accommodation space 17 of the head case 16.

In this manner, since the bonding resin 45 has a stacked structure of the photosensitive resin 43 and the bonding reinforcement resin 44, it is possible to achieve both of the patterning accuracy and the adhesion reliability of the photosensitive resin 43. That is, regarding the photosensitive resin 43 in the bonding resin 45, it is possible to advance the curing in comparison with the related art by the exposure or the heating in a previous stage of the developing, and it is possible to improve the patterning accuracy. Meanwhile, since the adhesion strength of the bonding resin 45 is reinforced by the bonding reinforcement resin 44, it is possible to bond the substrates to each other more firmly. Moreover, since it is possible to achieve both of the patterning accuracy of the photosensitive resin 43 and the adhesion reliability of the bonding resin 45, it is possible to manufacture the electronic device 14 more stably, and it is possible to expect to the improvement of a yield rate. Furthermore, in the configuration of adopting the element which is driven by the driving as the piezoelectric element 32, it is possible to reduce the damage of the bonding portion due to the driving, and it is possible to suppress the peeling off of the bonding portion. Thereby, it is possible to expect the improvement in the reliability of the electronic device 14. Therefore, it is possible to reinforce the bonding by using the adhesive agent of the low viscosity which does not have photosensitivity as the bonding reinforcement resin 44, and it is possible to contribute to cost reduction.

Figure 6A:
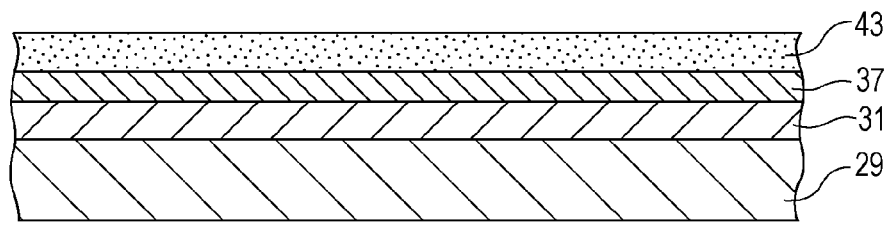
FIG. 6A to FIG. 6C are schematic views for describing manufacturing processes of an electronic device according to a second embodiment.
Figure 6B:
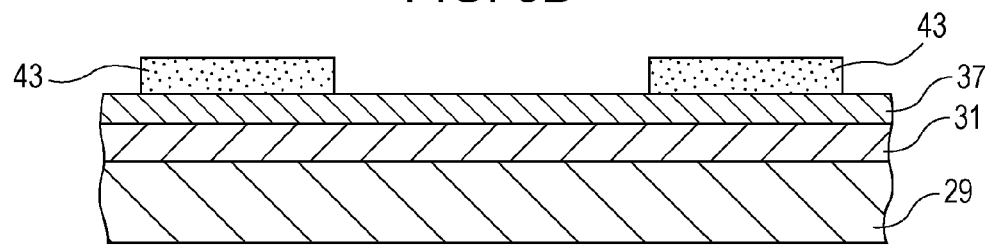
Figure 6C:
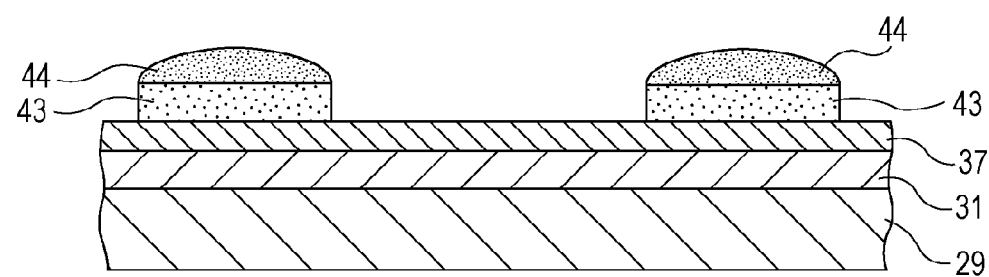

FIG. 6A to FIG. 6C, and FIG. 7A to FIG. 7C are schematic views for describing manufacturing processes of the electronic device 14 according to a second embodiment of the invention. In the embodiment, first, as illustrated in FIG. 6A, the photosensitive resin 43 is applied onto the pressure chamber forming substrate 29 and the vibrating plate 31. Subsequently, if the photosensitive resin 43 is applied, the photosensitive resin 43 is temporarily cured by the heat treatment, after being exposed through a mask of a predetermined pattern. After the temporary curing, the photosensitive resin 43 is patterned into a predetermined shape at a predetermined position where the developing is performed, as illustrated in FIG. 6B. Subsequently, if the photosensitive resin 43 is patterned, the bonding reinforcement resin 44 is applied onto the photosensitive resin 43 by the transfer method such that the bonding reinforcement resin 44 overlaps the photosensitive resin 43, as illustrated in FIG. 6C.

Figure 7A:
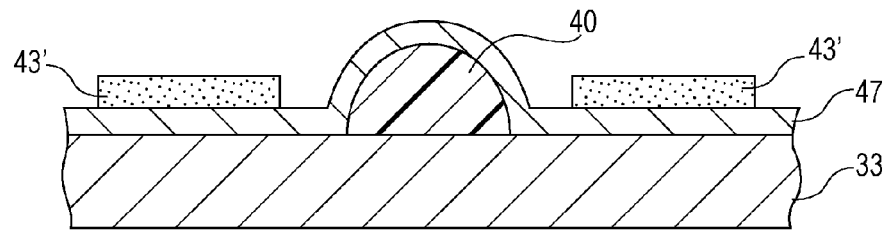
FIG. 7A to FIG. 7C are schematic views for describing the manufacturing processes of the electronic device according to the second embodiment.
Figure 7B:
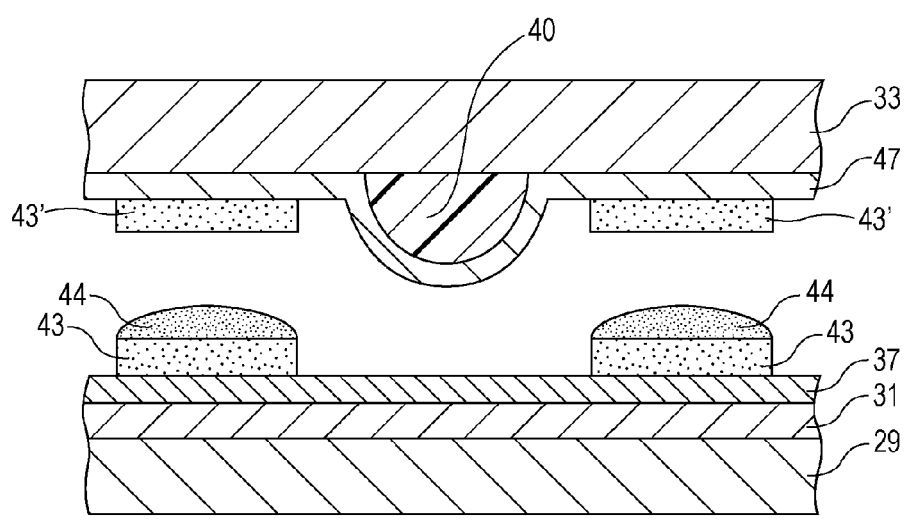
Figure 7C:
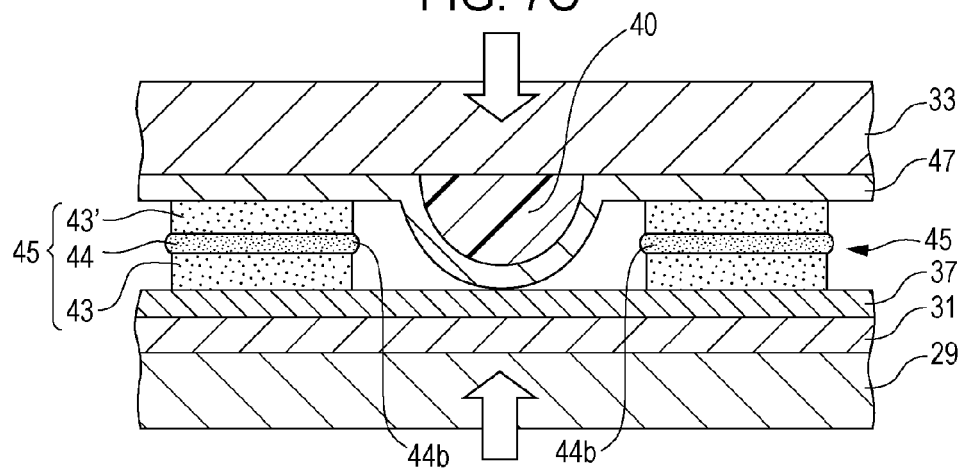
Figure 8A:
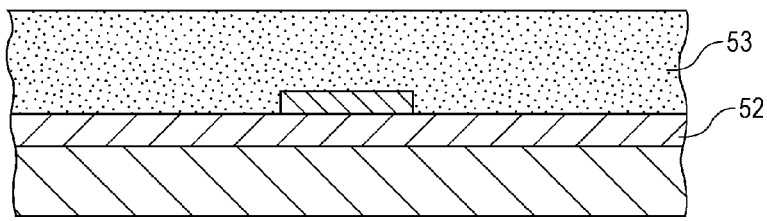
FIG. 8A to FIG. 8D are schematic views for describing manufacturing processes of an electronic device in the related art.
Figure 8B:
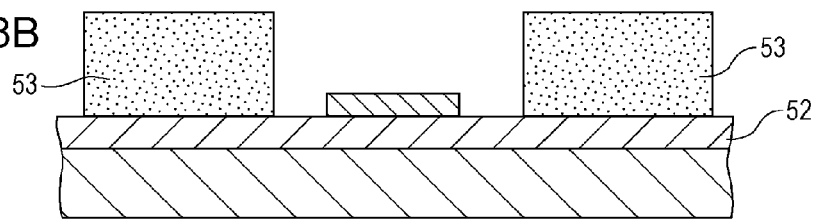
Figure 8C:
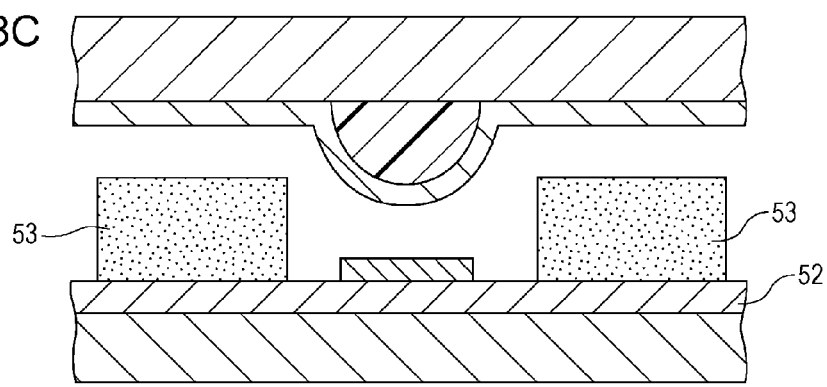
Figure 8D:
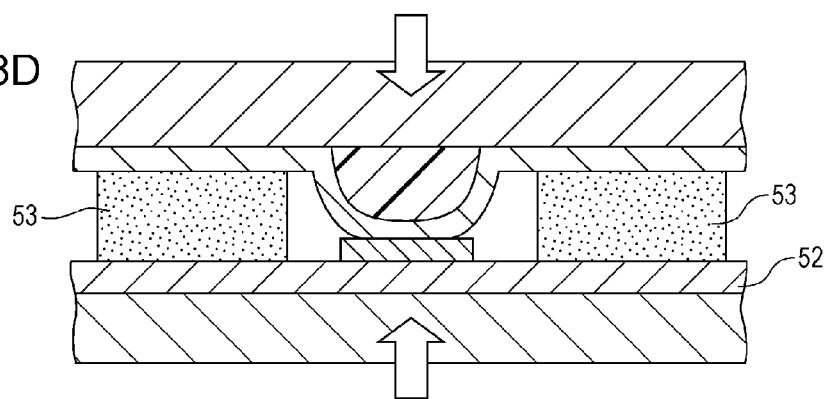

Next, as illustrated in FIG. 7A, a photosensitive resin 43' of the same type as the photosensitive resin 43 is applied to the bonding region by the bonding resin 45, in the silicon single crystal substrate of the sealing plate 33 side. Thereafter, the exposure, the heating, and the developing are sequentially performed, and the photosensitive resin 43' is patterned into a predetermined shape at the bonding region. Therefore, as illustrated in FIG. 7B, in the state where the relative positions of both of the silicon single crystal substrates are aligned, any one silicon single crystal substrate is relatively moved toward the other silicon single crystal substrate side, and the structure such as the bump electrode 40 or the piezoelectric element 32, and the bonding resin 45 are stuck together by being interposed between both of the silicon single crystal substrates. At that time, the bonding reinforcement resin 44 is interposed between the photosensitive resin 43 and the photosensitive resin 43'. In this state, both of the silicon single crystal substrates are pressurized from the upper and lower direction while resisting the elastic restoring force of the bump electrode 40. At that time, the bonding reinforcement resin 44 swells outward (side direction of the direction which is orthogonal to the stacking direction) from both of the photosensitive resins 43 and 43' by applying the pressure between the photosensitive resin 43 and the photosensitive resin 43'. As a result, as illustrated in FIG. 7C, a portion (swelling unit 44*b*) which swells outward from the photosensitive resins 43 and 43' is formed in the bonding reinforcement resin 44. Therefore, the heat treatment (post-baking) is performed in the state where the pressure between the substrates is maintained. As a result, in the state where the bump electrode 40 is electrically connected to the lower electrode layer 37 and the upper electrode layer 39 in the non-drive region, both of the substrates are bonded to each other by the bonding resin 45. According to the configuration, the photosensitive resin 43' of the same type as the photosensitive resin 43 is formed in the bonding region of the bonding resin 45 in the other substrate, and thereby, the bonding reinforcement resin 44 is not in contact directly with the substrate. Hence, it is possible to prevent the bonding reinforcement resin 44 from wetting and spreading with respect to the substrate. Therefore, it is possible to arrange the bonding resin 45 by making the bonding resin 45 be closer to the structure (for example, the bump electrode 40) in the substrate. Thereby, it is possible to make the high density of the structure and the bonding resin 45 in the substrate, and it is possible to contribute to the miniaturization of the electronic device 14. Furthermore, since other configurations are the same as the embodiment described above, the description thereof will be omitted.

In addition to the embodiments described above, it is possible to adopt a configuration in which the substrates are bonded to each other in the state of positioning both of the resins by patterning the photosensitive resin 43 in one substrate, and applying the bonding reinforcement resin 44 in the other substrate.

Moreover, the method for applying the bonding reinforcement resin 44 is not limited to the exemplified transfer method. For example, it is possible to adopt a configuration in which the bonding reinforcement resin 44 is applied by using a dispenser.

Furthermore, in the embodiments described above, the adhesive agent which does not have photosensitivity is exemplified as a bonding reinforcement resin 44, but it is not limited thereto, and it is possible to adopt a resin having photosensitivity. In this case, the prebaking is not performed with respect to the bonding reinforcement resin 44, and thereby, it is possible to reinforce the bonding strength at the time of bonding the substrates to each other.

Hitherto, the ink jet type recording head which is mounted in the ink jet type printer is exemplified as a liquid ejecting head, but a liquid ejecting head that ejects the liquid other than the ink can be applied. For example, it is possible to apply the invention to a color material ejecting head that is used in manufacturing a color filter such as a liquid crystal display, an electrode material ejecting head that is used in forming an electrode such as an organic electro luminescence (EL) display or a field emission display (FED), and a bio-organic matter ejecting head that is used in manufacturing a biochip (biochemical element).

Therefore, the invention is not limited to the example which is used as an actuator in the liquid ejecting head. For example, the invention can be also applied to the electronic device which is used in various types of sensors or the like.

What is claimed is:

1. An electronic device comprising:
a first substrate; and
a second substrate that is bonded to the first substrate in a state of being spaced from each other with a gap by interposing a bonding resin between the first substrate and the second substrate,
wherein:
the bonding resin is configured by stacking a photosensitive resin and a bonding reinforcement resin which is different from the photosensitive resin,
the photosensitive resin is patterned on at least one substrate of the first substrate and the second substrate, and
the bonding reinforcement resin which is stacked on the patterned photosensitive resin, has a wet-spreading portion or a portion which swells outward from the photosensitive resin,
wherein at least one of the first and second substrates includes a bump electrode.

2. The electronic device according to claim 1, wherein the bonding reinforcement resin is an adhesive agent which does not have photosensitivity, and of which viscosity is lower than that of the photosensitive resin.

3. The electronic device according to claim 1, wherein a resin of the same type as the photosensitive resin or the bonding reinforcement resin is formed at a bonding region between the bonding resin and the other substrate of the first substrate and the second substrate, the resin of the same type as the photosensitive resin or the bonding reinforcement resin bonding with the bonding resin of the one substrate.

4. The electronic device according to claim 1 comprising:
an actuator disposed in the gap,
wherein at least a portion of the bonding resin is placed between the bump electrode and the actuator.

5. The electronic device according to claim 1, wherein the photosensitive resin is patterned on the first substrate,
wherein the bump electrode is included in the second substrate.

6. The electronic device according to claim 1, wherein the bump electrode is formed on at least one of the first and second substrates.

* * * * *